US010527951B2

(12) United States Patent
Yohanan et al.

(10) Patent No.: US 10,527,951 B2
(45) Date of Patent: Jan. 7, 2020

(54) COMPOUND IMAGING METROLOGY TARGETS

(71) Applicant: KLA-TENCOR CORPORATION, Milpitas, CA (US)

(72) Inventors: Raviv Yohanan, Qiryat Motzkin (IL); Eran Amit, Haifa (IL); Mark Ghinovker, Yoqneam Ilit (IL); Tal Itzkovich, Kfar Uriya (IL); Nuriel Amir, St. Yokne'am (IL)

(73) Assignee: KLA-Tencor Corporation, Milpitas, CA (US)

( * ) Notice: Subject to any disclaimer, the term of this patent is extended or adjusted under 35 U.S.C. 154(b) by 221 days.

(21) Appl. No.: 15/057,723

(22) Filed: Mar. 1, 2016

(65) Prior Publication Data

US 2016/0179017 A1   Jun. 23, 2016

Related U.S. Application Data

(63) Continuation of application No. PCT/US2015/036825, filed on Jun. 19, 2015.
(Continued)

(51) Int. Cl.
*G03F 7/20* (2006.01)

(52) U.S. Cl.
CPC ...... *G03F 7/70633* (2013.01); *G03F 7/70625* (2013.01); *G03F 7/70683* (2013.01)

(58) Field of Classification Search
CPC ..... G01B 11/02; G01B 11/14; G03F 7/70616; G03F 7/70625; G03F 7/70633; G03F 7/70683; G03F 7/70516; H01L 22/00; H01L 22/12; H01L 23/544

USPC ....... 356/399–401, 625, 630, 634, 635, 636; 250/548; 355/53, 55, 77; 430/5, 22, 30; 382/151; 438/401; 257/797

See application file for complete search history.

(56) References Cited

U.S. PATENT DOCUMENTS 6,486,954 B1 * 11/2002 Mieher ................ G01B 11/002
                                                                  356/399
7,408,642 B1    8/2008 DiBiase
(Continued)

FOREIGN PATENT DOCUMENTS

WO    WO 2014/081913 A1 *  5/2014

OTHER PUBLICATIONS

"Interferometric Method of Checking the Overlay Accuracy in Photolitho Graphic Exposure Processes," Mar. 1, 1990, IBM Technical Disclosure Bulletin, vol. 32, Issue 10B, pp. 214-217.*

*Primary Examiner* — Gordon J Stock, Jr.
(74) *Attorney, Agent, or Firm* — Suiter Swantz pc llo

(57) ABSTRACT

Imaging metrology targets and methods are provided, which combine one-dimensional (1D) elements designed to provide 1D imaging metrology signals along at least two measurement directions and two-dimensional (2D) elements designed to provide at least one 2D imaging metrology overlay signal. The target area of the 1D elements may enclose the 2D elements or the target areas of the 1D and 2D elements may be partially or fully congruent. The compound targets are small, possibly multilayered, and may be designed to be process compatible (e.g., by segmentation of the elements, interspaces between elements and element backgrounds) and possibly be produced in die. Two dimensional elements may be designed to be periodic to provide additional one dimensional metrology signals.

21 Claims, 9 Drawing Sheets

Related U.S. Application Data

(60) Provisional application No. 62/015,398, filed on Jun. 21, 2014.

(56) References Cited

U.S. PATENT DOCUMENTS

| | | | |
|---|---|---|---|
| 9,490,217 B1* | 11/2016 | Lin | H01L 29/785 |
| 2003/0021465 A1* | 1/2003 | Adel | G03F 7/70633 |
| | | | 382/151 |
| 2003/0156276 A1 | 8/2003 | Bowes | |
| 2004/0169861 A1* | 9/2004 | Mieher | G01N 21/956 |
| | | | 356/400 |
| 2006/0103034 A1 | 5/2006 | Fu et al. | |
| 2006/0177120 A1 | 8/2006 | Ghinovker et al. | |
| 2007/0058169 A1* | 3/2007 | Ausschnitt | G03F 7/70633 |
| | | | 356/401 |
| 2008/0106738 A1 | 5/2008 | Yo-Jong | |
| 2013/0242305 A1* | 9/2013 | Cohen | G03F 7/70633 |
| | | | 356/400 |
| 2014/0240705 A1* | 8/2014 | Takimoto | G03F 9/00 |
| | | | 356/401 |
| 2014/0375984 A1* | 12/2014 | Choi | G01N 21/93 |
| | | | 356/73 |

* cited by examiner

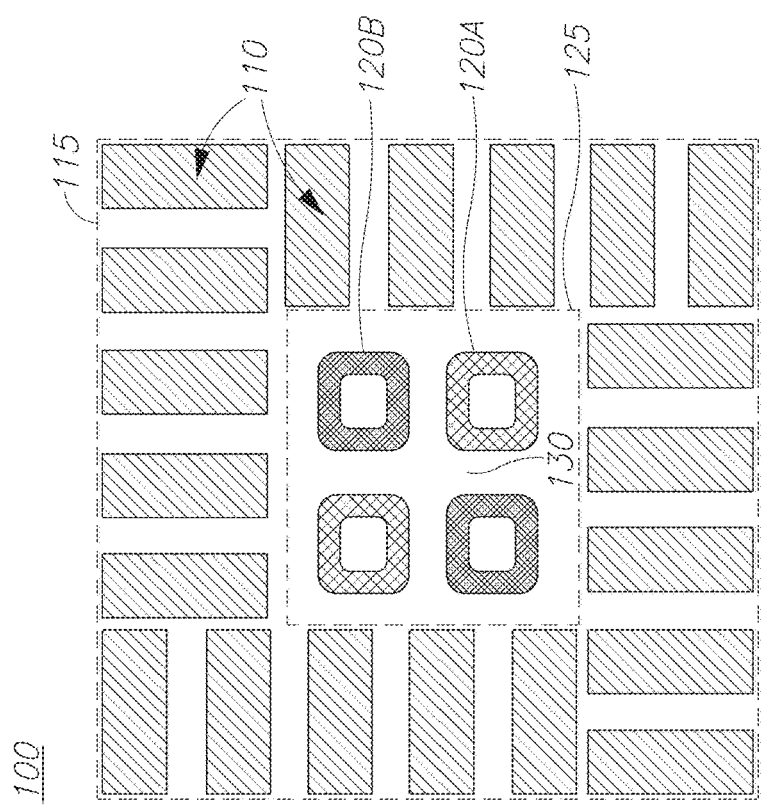
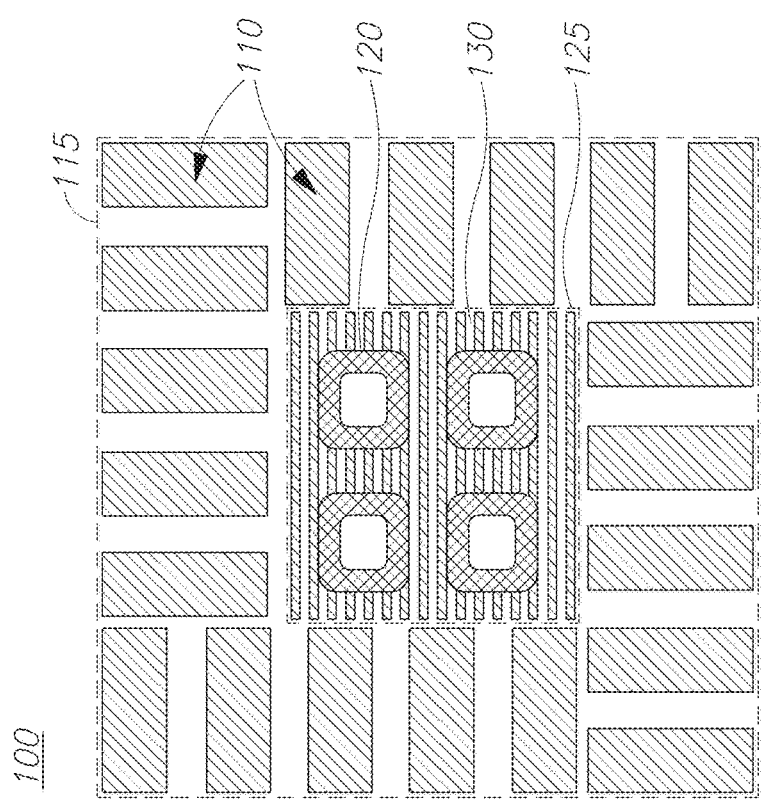
Figure 2B
Figure 2A

*200*

210 — DESIGNING 1D ELEMENTS WITHIN AN IMAGING METROLOGY TARGET TO PROVIDE 1D IMAGING METROLOGY SIGNALS ALONG AT LEAST TWO MEASUREMENT DIRECTIONS

212 — CONFIGURING THE 1D ELEMENTS PAIRWISE, ONE PAIR PER MEASUREMENT DIRECTION WITH PAIR MEMBERS AT DIFFERENT TARGET LAYERS

220 — DESIGNING 2D ELEMENTS WITHIN THE IMAGING METROLOGY TARGET TO PROVIDE AT LEAST ONE 2D IMAGING METROLOGY OVERLAY SIGNAL

222 — CONFIGURING THE 2D ELEMENTS PAIRWISE WITH PAIR MEMBERS AT DIFFERENT TARGET LAYERS

225 — ENCLOSING THE 2D ELEMENTS WITHIN A PERIPHERY OF THE 1D ELEMENTS

227 — SEGMENTING ELEMENT BACKGROUNDS, INTERSPACES BETWEEN ELEMENTS AND/OR THE ELEMENTS THEMSELVES

228 — DERIVING A TARGET DESIGN FILE OF THE IMAGING METROLOGY TARGET

COMPOUND IMAGING METROLOGY TARGETS

CROSS REFERENCE TO RELATED APPLICATIONS

This application is filed under 35 U.S.C, § 120 and § 365(c) as a continuation of International Patent Application Serial No. PCT/US15/36825, filed on Jun. 19, 2015, which application claims the benefit under 35 U.S.C. § 119(e) of U.S. Provisional Patent Application No. 62/015,398 filed on Jun. 21, 2014, which applications are incorporated herein by reference in their entirety.

FIELD OF THE INVENTION

The present invention relates to the field of imaging metrology, and more particularly, to compound targets for imaging metrology.

BACKGROUND OF THE INVENTION

Current imaging metrology targets such as AIM (advance imaging metrology) targets provide a one dimensional signal using periodic one dimensional symmetric target elements such as gratings. Current imaging metrology targets such as Box-in-Box (BiB), Blossom or AIMid targets provide a two dimensional signal using non-periodic structures that usually have two symmetry axes such as bars, rectangles or crosses. These two types of current imaging metrology targets are exemplified in FIGS. 1A and 1B.

FIGS. 1A and 1B schematically illustrate representatives of two generic types of metrology targets, according to the prior art. A first type, represented by an AIM target 91 in FIG. 1A, is used to derive one-dimensional projection signals 65 of respective periodic elements 61, 62, 71, 72, which are used to calculate one-dimensional overlays. Corresponding pairs of periodic elements (having the same direction, each pair in a different layer, e.g., 61, 71 in one measurement direction and 62, 72 in another measurement direction) are used to calculate one-dimensional overlays between the respective one-dimensional projection signals 65 at the corresponding direction. The overall (two-dimensional) overlay is calculated from the two independent one-dimensional overlays. The typical size of AIM target 91 is several tens of micrometers, e.g., 20-40 µm (side length). A second type, represented by an AIMid target 92 in FIG. 1B, is used to derive two-dimensional centers 64, 74 from rotations (marked by arrows) of target elements 63, 73, 66, 76 (having, in the illustrated example, a four-fold rotational symmetry) in the plane. The pairs of target elements (e.g., 63, 66 in one layer, 73, 76 in another layer) are used to calculate a two-dimensional overlay between respective centers 64, 74 of the target elements in each layer. The typical size of AIMid target 92 is 10 µm (side length). AIM and AIMid targets 91, 92 may be multilayered, i.e., including respective pairs over multiple layers, and be used to derive one- and two-dimensional overlays respectively in a similar manner. The terms previous layer and current layer are used to refer to the former being produced prior to and lying below the latter (numerals 61, 62, 63, 66 refer to structures at the previous layer, numerals 71, 72, 73, 76 refer to structures at the current layer). No or any number of layers may separate the previous and current layers, and the target designs may be made to include several "previous" and/or several "current" layers.

BRIEF SUMMARY OF THE INVENTION

One aspect of the present invention provides an imaging metrology target comprising: a plurality of 1D elements designed to provide a respective plurality of one-dimensional (1D) imaging metrology signals along at least two measurement directions; and a plurality of 2D elements designed to provide at least one two-dimensional (2D) imaging metrology overlay signal, wherein a periphery of the 1D elements encloses the 2D elements.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings:

FIG. 2A is a high level schematic illustration of imaging metrology targets having 2D elements enclosed by 1D elements, according to some embodiments of the invention;

FIG. 2B is a high level schematic illustration of imaging metrology targets having 2D elements enclosed by 1D elements, according to some embodiments of the invention;

DETAILED DESCRIPTION OF THE INVENTION

Prior to the detailed description being set forth, it may be helpful to set forth definitions of certain terms that will be used hereinafter.

Figures 1A, 1B:
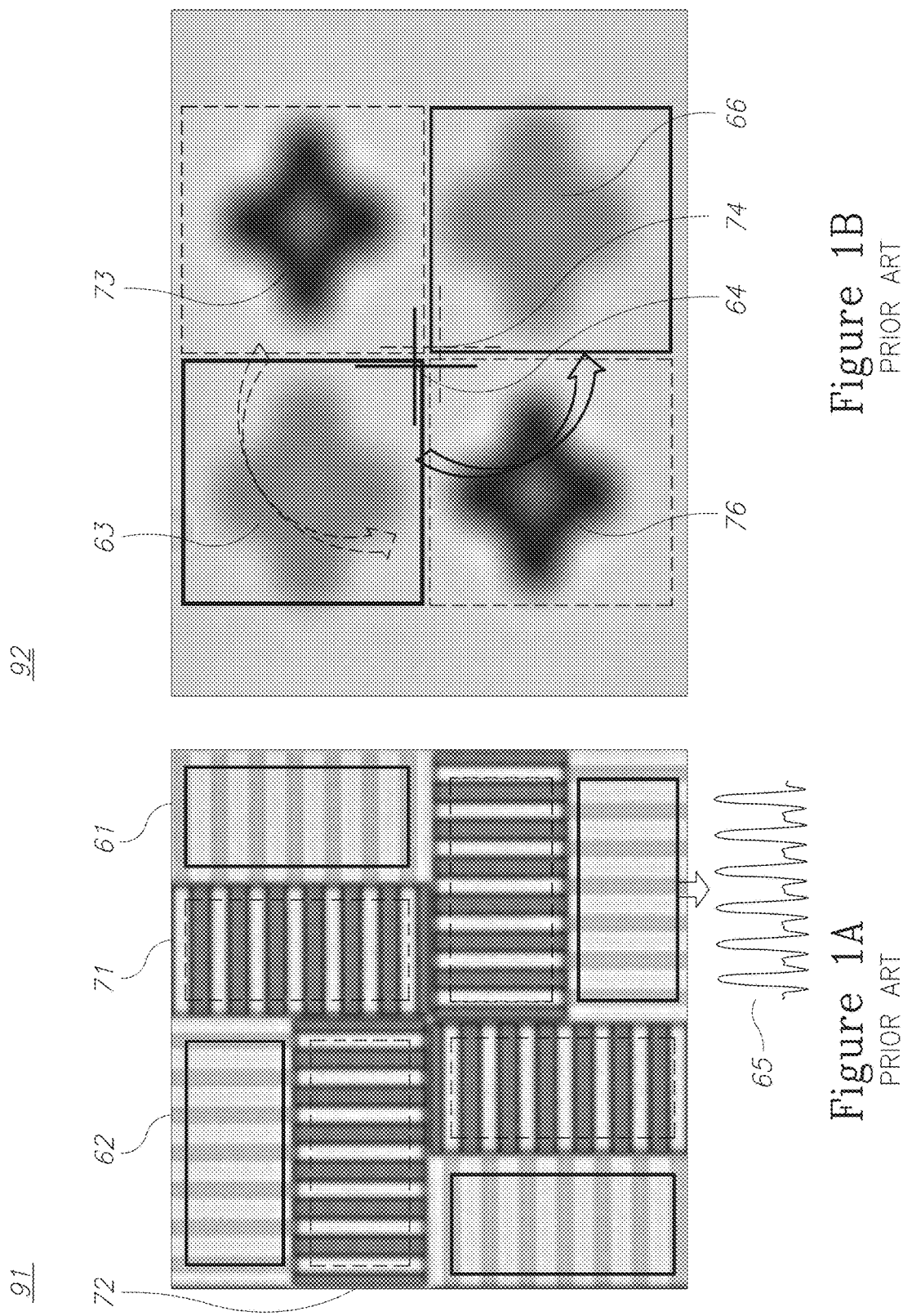
FIG. 1A is a schematic representation of a generic type of metrology targets, according to the prior art.
FIG. 1B is a schematic representation of a generic type of metrology targets, according to the prior art.

The term "1D element" as used in this application refers to a periodic target structure designed to provide a one-dimensional (1D) imaging metrology signal along a certain measurement direction in the plane of the target. For example, 1D elements may be gratings as illustrated in FIG. 1A.

The term "2D element" as used in this application refers to a target structure designed to provide a two-dimensional 2D) imaging metrology signal with respect to two measurement directions in the plane of the target. For example, 2D elements may be fourfold rotationally symmetric with respect to the two measurement directions, as illustrated in FIG. 1B. However, 2D elements may also be periodic.

The term "layer" as used in this application refers to any target layer produced in the photolithography process such as a polysilicon layer, a contact layer, a resist etc. The term "current layer" as used in this application refers to the uppermost layer at a given production stage and the term "previous layer" as used in this application refers to lower layers, below the current layer. It is noted that target layers may be interspaced with no or any number of intermediate layers.

The term "background" as used in this application refers to any part of the target which is not the 1D or 2D elements, such as interspaces between elements at the some layer and lower or upper target layers.

The term "segmentation" as used in this application refers to target structures which are smaller than the elements, which are used to reduce the size of unchanging regions of target in order to improve production process compatibility. The term "segmentation" as used in this application refers either to the 1D and 2D elements themselves which may be designed as being composed of smaller structures, or to background regions between elements or at a different overlapping layer.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

Imaging metrology targets and methods are provided, which combine 1D elements designed to provide one-dimensional (1D) imaging metrology signals along at least two measurement directions and 2D elements designed to provide at least one two-dimensional (2D) imaging metrology overlay signal. The target area of the 1D elements may enclose the 2D elements or the target areas of the 1D and 2D elements may be partially or fully congruent. In certain embodiments, the target area of the 2D elements may enclose the 1D elements. The compound targets are small (e.g., have a short side of 5-15 μm, e.g., 10 μm for two layered targets) and may be designed to be process compatible (e.g., by segmentation of the elements, interspaces between elements and element backgrounds) and possibly be produced in die. The compound targets may be designed in various configurations of multiple layers having 1D and/or 2D elements. For example, layers may be a currently produced layer, a polysilicon layer, a contact layer, a resist or any other layer involved in the photolithography process. The compound target combines two types of symmetry, e.g., periodic 1D elements and fourfold symmetric 2D elements. Two dimensional elements may be designed to be periodic to provide additional one dimensional metrology signals. Corresponding algorithms may be applied to the measured signals, possibly simultaneously.

FIGS. 2-6 are high level schematic illustrations of imaging metrology targets 100, according to some embodiments of the invention. Certain embodiments comprise an imaging metrology target 100 comprising a plurality of 1D elements 110 designed to provide a respective plurality of one-dimensional (1D) imaging metrology signals along at least two measurement directions and a plurality of 2D elements 120 designed to provide at least one two-dimensional (2D) imaging metrology overlay signal, wherein a periphery 115 of 1D elements 110 encloses 2D elements 120.

One dimensional elements 110 may comprise at least two pairs of 1D elements 110, one pair along each measurement direction, with 1D elements 110 of each pair located at different target layers. Two dimensional elements 120 may comprise at least two pairs of 2D elements 120, with 2D elements 120 of each pair located at different target layers. Imaging metrology target 100 may comprise 1D elements 110 and/or 2D elements 120 at more than two layers, with no or any number of intermediate layers. Corresponding target designs according to the disclosed and illustrated principles are likewise part of the present disclosure. In certain embodiments, One dimensional elements 110 may be gratings. Two dimensional elements 120 may be symmetric with relation to a 180° rotation or have a fourfold rotational symmetry (e.g., comprise bars, rectangles or crosses). In certain embodiments, 2D elements 120 may be perpendicular gratings.

In certain embodiments, imaging metrology target 100 may be at most 15 μm×15 μm (at periphery 115, see below). In certain embodiments, imaging metrology target 100 may be at most 10 μm×10 μm (at periphery 115). In certain embodiments, imaging metrology target 100 might even be at most 5 μm×5 μm. In certain embodiments, imaging metrology target 100 may be rectangular with dimension of e.g., 15 μm×10 μm, 10 μm×5 μm or intermediate dimension. Such dimensions are much smaller than current targets 91 for one dimensional signal measurement such as AIM and approach or even reach the dimensions of current targets 92 for two dimensional overlay measurements, yet still provide signals of both types. In certain embodiments, targets 100 may be produced in-die, i.e., in close proximity to actual devices and integrated in the device design files.

Any part of the background of 1D elements 110 and/or 2D elements 120 (e.g., interspaces between elements at the same layer, or lower or upper layers) may be segmented or filled with segments which reduce the size of unchanging regions of target 100. 1D elements 110 and/or 2D elements 120 may be segmented (e.g., perpendicularly to background segmentation) to further reduce the size of unchanging regions of target 100.

Non-limiting examples for imaging metrology targets 100 designed according to these principles are presented below.

Corresponding target design files of targets 100, methods for designing and producing targets 100 as well as metrology signals derived from targets 100 by metrology tools are likewise part of the present disclosure.

FIGS. 2A and 2B are high level schematic illustrations of imaging metrology targets 100 having 2D elements 120 enclosed by 1D elements 110, according to some embodiments of the invention. In FIGS. 2A and 2B, 1D elements 110 are gratings which enclose rectangular (or any other form having a four-fold rotational symmetry) 2D elements 120, i.e., a periphery 125 of 2D elements 120 is smaller than a periphery 115 of 1D elements 110.

A background 130 of 2D elements 120, which may be located at the same layer as 2D elements 120 or in a different layer, may be segmented (FIG. 2A), be filled with smaller elements to avoid having a continuous, unchanging region in target 100 which may lead to production inaccuracies. Segmentation may be applied to any background area, such as a background of 1D elements 110 or interspaces between 1D elements, as well as to 1D elements 110 and/or 2D elements 120 themselves, e.g., non-parallel to background segmentation. FIG. 2B explicitly illustrates 2D elements 120A, 120B being in different layers. It is noted that in all disclosed targets 100, different 1D elements 110 may be in different layers, different 2D elements 120 may be in different layers, and 1D elements 110 may be in the same or different layers than 2D elements 120. In non-limiting examples, 1D elements 110 may comprise pairs of 1D elements 110, one at each layer, along each measurement direction and 2D elements 120 may comprise pairs of 2D elements 120 at each layer. The number of layers may be one, two or larger.

In certain embodiments, targets 100 may be multilayered and have 1D elements 110 in e.g., three or four layers and 2D elements 120 in multiple layers. 1D elements 110 may be designed at target 100's previous (lower) layer and 2D elements 120 may be designed at target 100's current (upper) layer. In certain embodiments this order may be reversed, or 1D and 2D elements 110, 120 may be designed at both layers. Referring to FIG. 2B, 1D elements 110 may be designed at one layer and 2D elements 120A, 120B may be designed at two different layers (different from the 1D elements layer as well). Any of the elements and structures may be segmented to enhance process compatibility.

In certain embodiments, a side of target 100 may be 10 μm long, having, e.g., grating structures of ca. 1 μm×2.5 μm interspaced by ca. 0.4 μm in 1D elements 110 designed as gratings and respectively sized 2D elements 120.

Figures 3A, 3B:
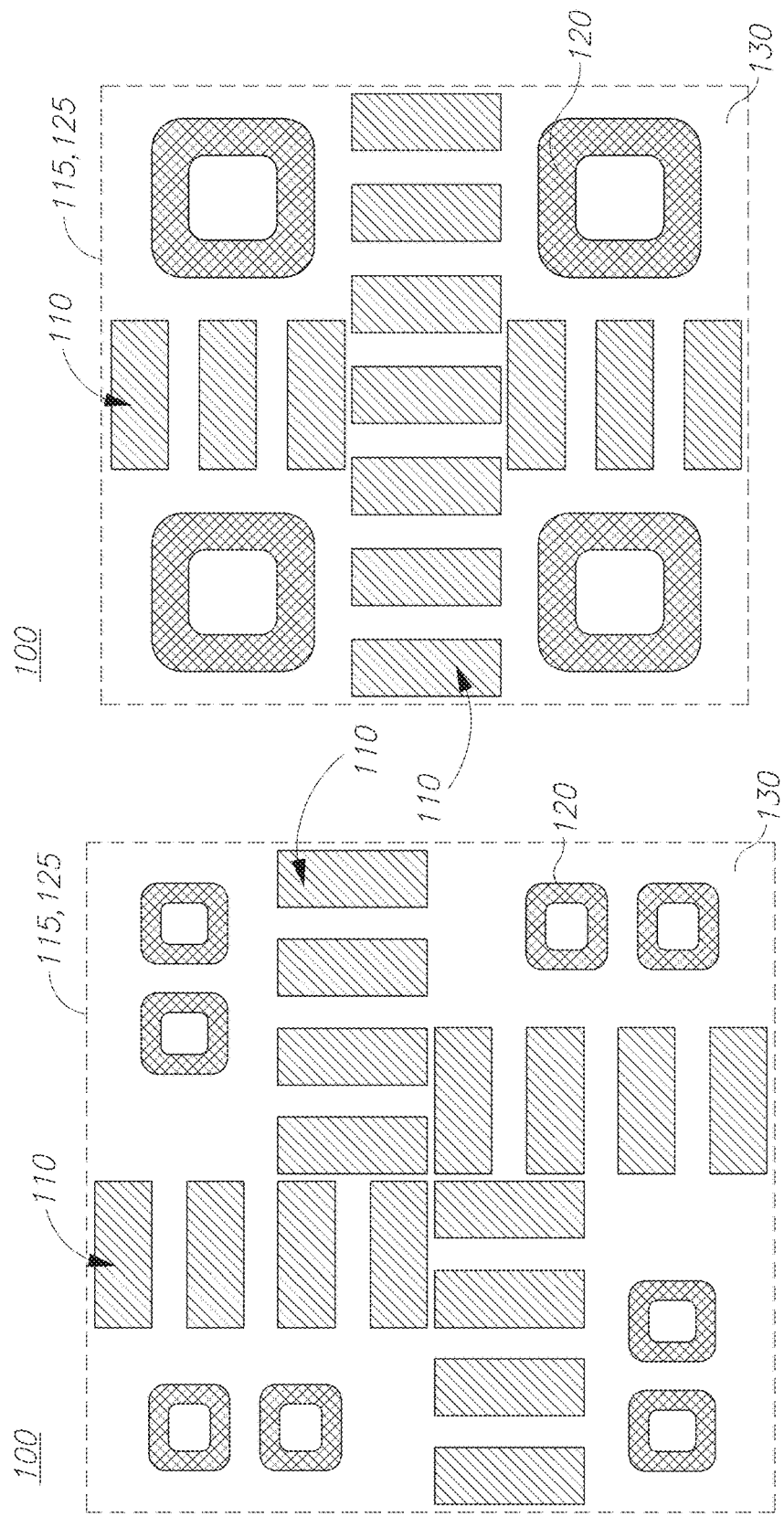
FIG. 3A is a high level schematic illustration of imaging metrology targets having 2D elements with a similar periphery as 1D elements, according to some embodiments of the invention.
FIG. 3B is a high level schematic illustration of imaging metrology targets having 2D elements with a similar periphery as 1D elements, according to some embodiments of the invention.

FIGS. 3A and 3B are high level schematic illustrations of imaging metrology targets 100 having 2D elements 120 with a similar periphery as 1D elements 110, according to some embodiments of the invention. In FIGS. 3A and 3B, 1D elements 110 are gratings which interspace rectangular 2D elements 120, i.e., periphery 125 of 2D elements 120 is similar to periphery 115 of 1D elements 110. In FIGS. 3A and 3B, 2D elements 120 are wider apart than in FIGS. 2A and 2B while 1D elements 110 are at a more central location. In FIG. 3A, multiple 2D elements 120 may be designed at each quarter of target 100, to enhance accuracy or to involve more than two layers. In FIG. 3B, 1D elements 110 are central, yielding at least one longer grating to enhance accuracy or to enable smaller target dimensions. Segmentation may be applied to targets 100 in FIGS. 3A and 3B as well, e.g., at background 130.

In certain embodiments, periphery 125 of 2D elements 120 may be similar to or larger than periphery 115 of 1D elements 110. In certain embodiments, the target area of 1D elements 110 (i.e., the area within periphery 115) may partly or fully include the target area of 2D elements 120 (i.e., the area within periphery 125). In certain embodiments, the target area of 1D elements 110 (i.e., the area within periphery 115) may be partly or fully included within the target area of 2D elements 120 (i.e., the area within periphery 125). Target areas of 1D elements 110 (i.e., the area within periphery 115) and of 2D elements 120 (i.e., the area within periphery 125) may be partly or fully congruent.

In certain embodiments, targets 100 may be multilayered and have 1D elements 110 in e.g., three or four layers and 2D elements 120 in multiple layers. 1D elements 110 may be designed at target 100's previous (lower) layer and 2D elements 120 may be designed at target 100's current (upper) layer. In certain embodiments this order may be reversed, or 1D and 2D elements 110, 120 may be designed at both layers. Any of the elements and structures may be segmented to enhance process compatibility. In certain embodiments, a side of target 100 may be 10 μm long, having, e.g., grating structures of ca. 1 μm×2.5 μm interspaced by ca. 0.4 μm in 1D elements 110 designed as gratings and respectively sized 2D elements 120. In certain embodiments, a side of target 100 may be 5 μm long, or any size between 5 μm-15 μm. In certain embodiments, however, at least one side of target 100 may be larger, e.g., 20 μm, 30 μm or even up to 40 μm.

Figure 4B:
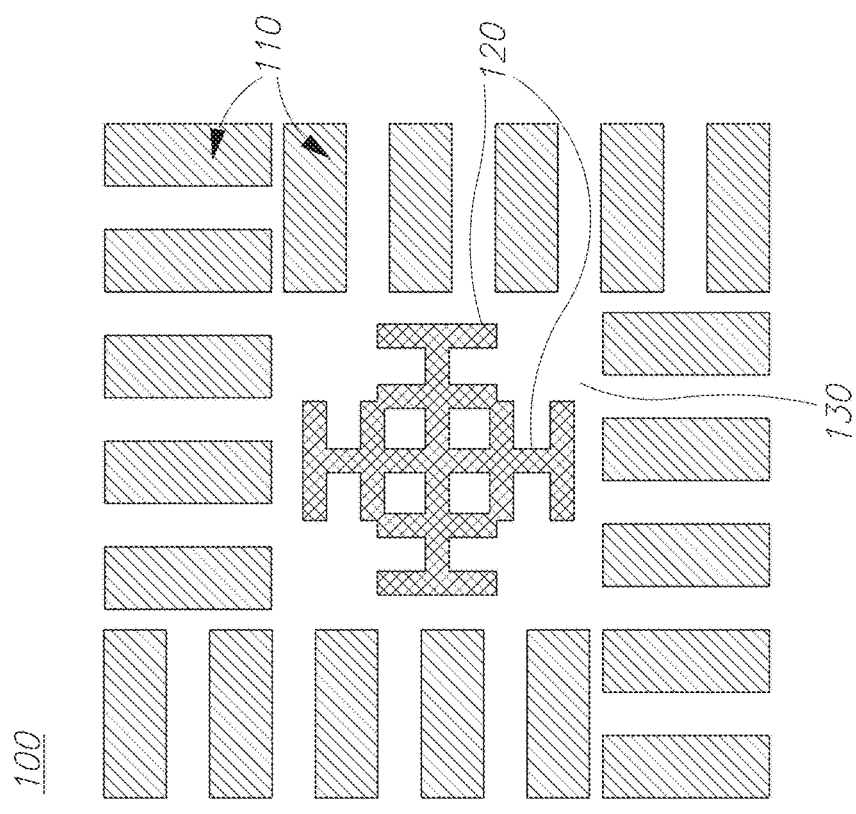
FIG. 4B is a high level schematic illustration of imaging metrology targets having intercrossing, grating-like 2D elements enclosed by 1D elements, according to some embodiments of the invention.
Figure 4A:
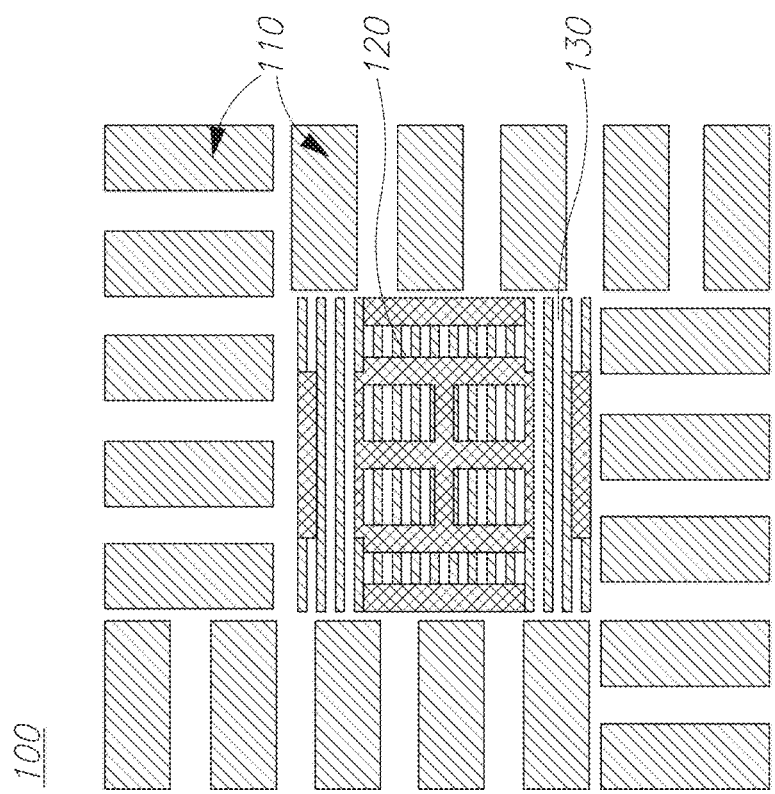
FIG. 4A is a high level schematic illustration of imaging metrology targets having intercrossing, grating-like 2D elements enclosed by 1D elements, according to some embodiments of the invention.

FIGS. 4A and 4B are high level schematic illustrations of imaging metrology targets 100 having intercrossing grating-like 2D elements 120 enclosed by 1D elements 110, according to some embodiments of the invention. In FIGS. 4A and 4B, 1D elements 110 are gratings which enclose rectangular 2D elements 120, i.e., a periphery of 2D elements 120 is smaller than the periphery of 1D elements 110. Background 130 of 2D elements 120 may be segmented (FIG. 4A). 2D elements 120 may be designed as intersecting gratings having different or the same pitches in different grating directions (FIGS. 4A and 4B, respectively).

Illustrated 2D elements 120 have a four-fold rotational symmetry as embodiments shown above, to be used to derive two-dimensional symmetry centers. Grating-like 2D elements 120 (designed e.g., as perpendicular gratings) may be further used as periodic structures for measuring one-dimensional projection signals in addition to measuring the two-dimensional center of symmetry of the form of 2D elements 120 as a whole and in addition to one-dimensional projection signals measured using 1D elements 110 in target 100. Such designs may further increase the overlay information which can be derived from target 100, or be used to reduce the target size. The illustrated design may be arranged to have a side length of 10 μm. In certain embodiments, a side of target 100 may be 10 μm long, having, e.g., grating structures of ca. 1 μm×2.5 μm interspaced by ca. 0.4 μm in 1D elements 110 designed as gratings and respectively sized 2D elements 120. In certain embodiments, a side of target 100 may be 5 μm long, or any size between 5-15 μm. In certain embodiments, however, at least one side of target 100 may be larger, e.g., 20 μm, 30 μm or even up to 40 μm.

Figure 5:
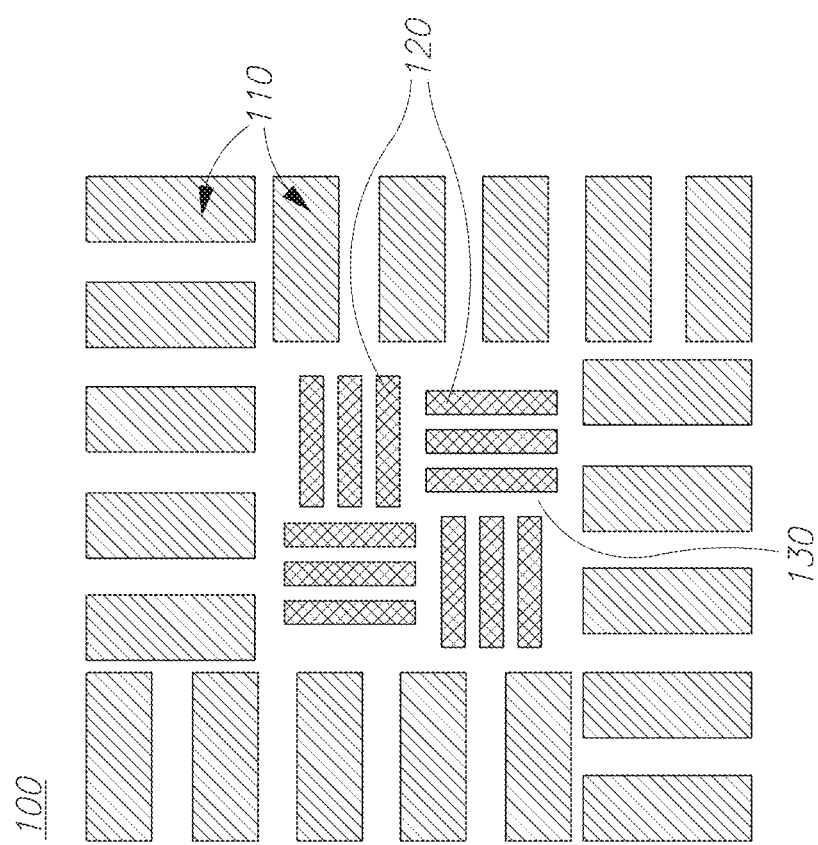
FIG. 5 is a high level schematic illustration of an imaging metrology target having separate grating-like 2D elements enclosed by 1D elements, according to some embodiments of the invention.

FIG. 5 is a high level schematic illustration of imaging metrology target 100 having separate grating-like 2D elements 120 enclosed by 1D elements 110, according to some embodiments of the invention. In FIG. 5, each 2D element 120 is designed as a grating, with pairs of 2D elements 120 having different grating directions (which may correspond to different layers).

2D elements 120, designed as gratings to have both rotational symmetry and periodicity, may be further used as periodic structures for measuring one-dimensional projection signals in addition to measuring the two-dimensional center of symmetry of the form of 2D elements 120 as a whole and in addition to one-dimensional projection signals measured using 1D elements 110 in target 100. Such designs may further increase the overlay information which can be derived from target 100, or be used to reduce the target size. The illustrated design may be arranged to have a side length of 10 µm. In certain embodiments, a side of target 100 may be 10 µm long, having, e.g., grating structures of ca. 1 µm×2.5 µm interspaced by ca. 0.4 µm in 1D elements 110 designed as gratings and respectively sized 2D elements 120. In certain embodiments, a side of target 100 may be 5 µm long, or any size between 5-15 µm. In certain embodiments, however, at least one side of target 100 may be larger, e.g., 20 µm, 30 µm or even up to 40 µm.

Figure 6:
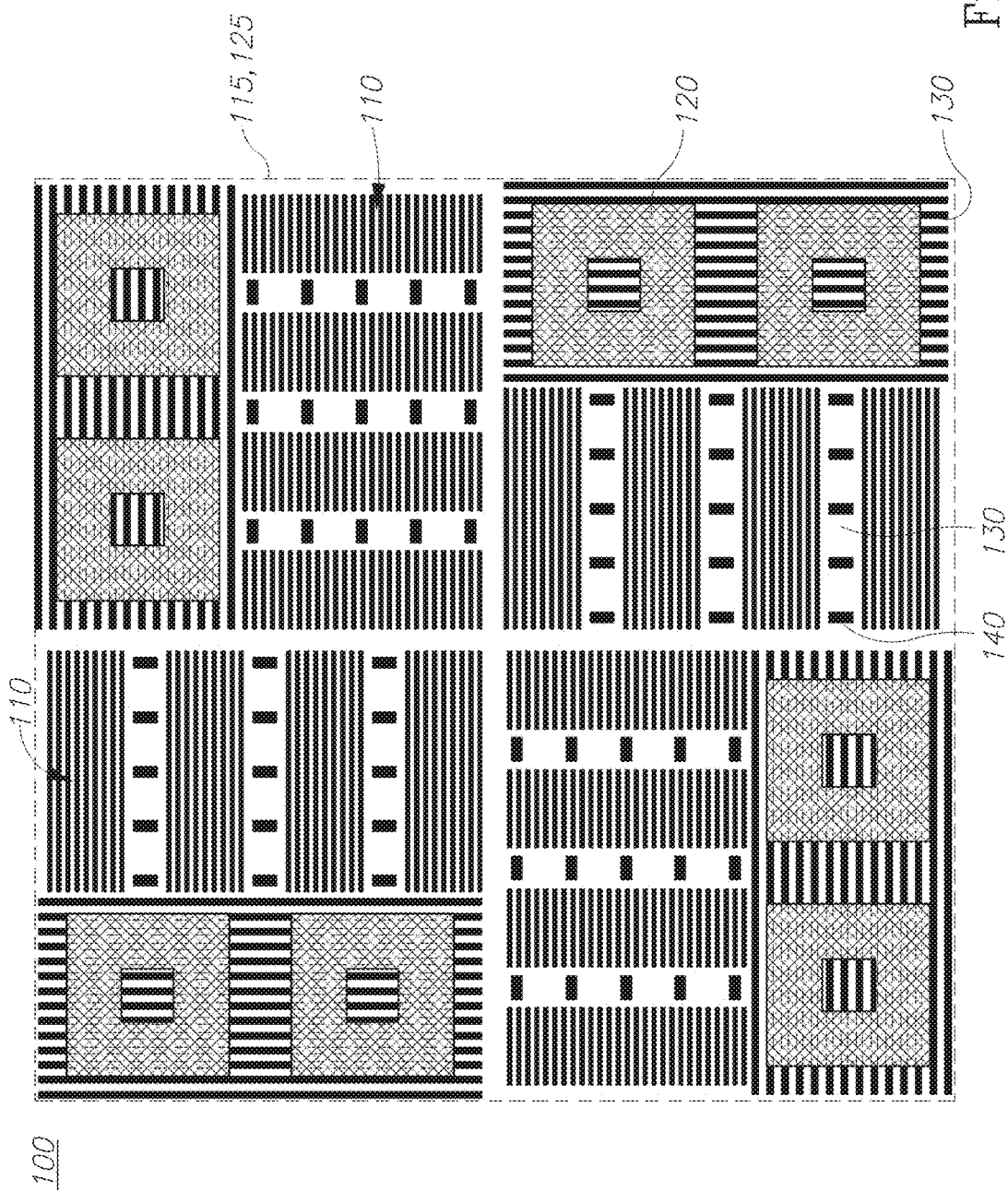
FIG. 6 is a high level schematic illustration of a segmented imaging metrology target, according to some embodiments of the invention.

FIG. 6 is a high level schematic illustration of segmented imaging metrology target 100, according to some embodiments of the invention. FIG. 6 illustrates a more detailed design of target 100 presented in FIG. 3A, with segmentation applied to background regions 130 and overlapping target areas for 1D elements 110 and 2D elements 120 (and target peripheries 115, 125, respectively). In FIG. 6, background segmentation of 2D elements 120 is in a different layer, while segmentation 140 of the interspaces between 1D elements 110 (as background 130) is also illustrated. Furthermore, 1D elements 110 themselves are segmented as may possibly be 2D elements 120. These design principles may be applied to any of disclosed targets 100 to make them more process compatible and reduce errors resulting from production inaccuracies.

In any of the disclosed embodiments, the specific forms of 1D and 2D target elements 110, 120 (respectively), used to measure one- and two-dimensional overlays (respectively) may be specifically designed according to any requirements. The overall size of target 100 may be similar to the size of current AIMid targets 92 (e.g., 10-15 µm side length). In certain embodiments, the overall size of target 100 may be similar to or smaller than the size of current AIM targets 91 (or generally between 5-40 µm).

The illustrated design may be arranged to have a side length of 10 mm. Imaging metrology targets 100 may be produced in die, in proximity to the devices. Targets 100 according to these principles may also be multilayered, i.e., target features of either or both types may be added in additional layers. Respective measurement algorithms are applied to any part of the target according to its measurement principles. One- and two-dimensional overlay measurements derived from a single target may be compared for enhancing accuracy and reliability.

Figure 7:
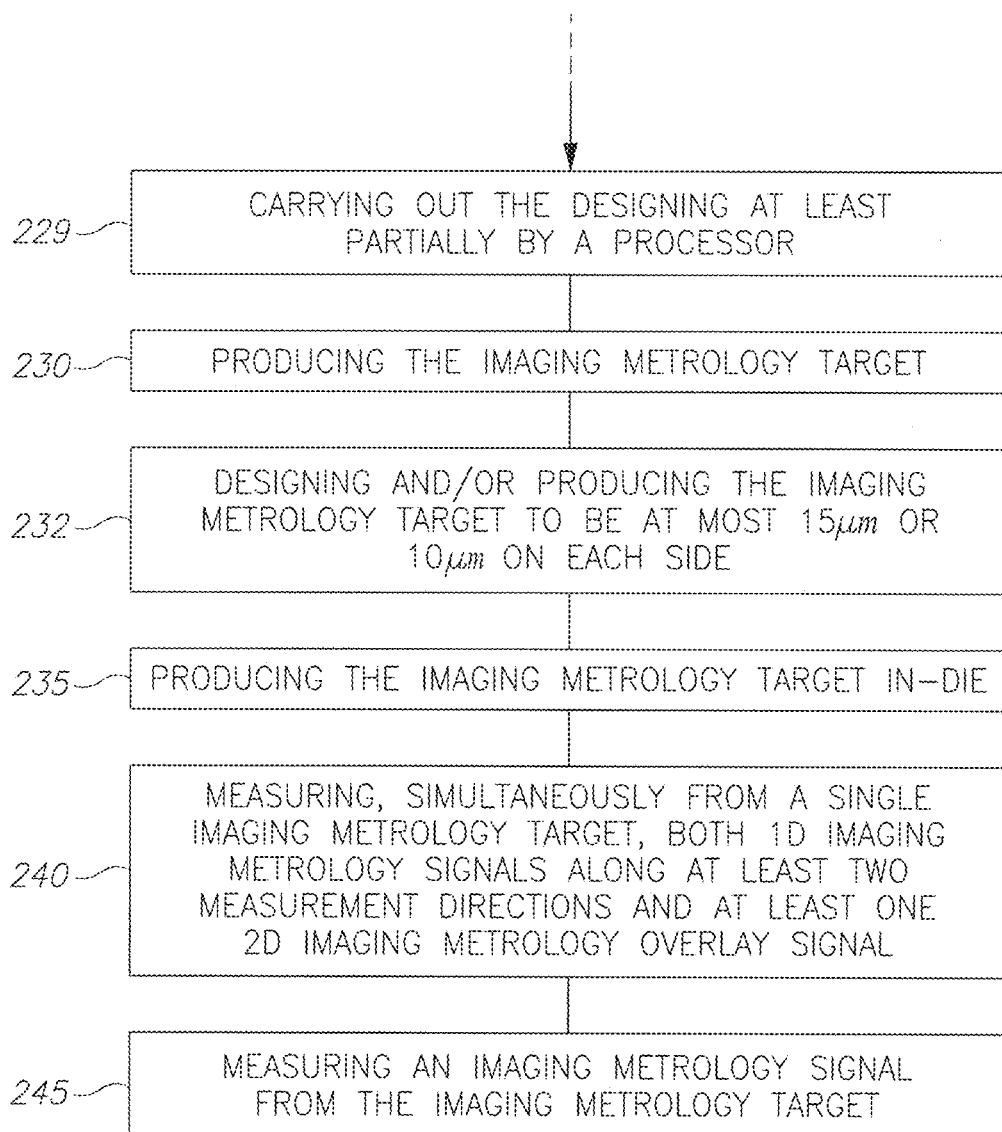
FIG. 7 is a high level flowchart illustrating a method, according to some embodiments of the invention.
Figure 8:
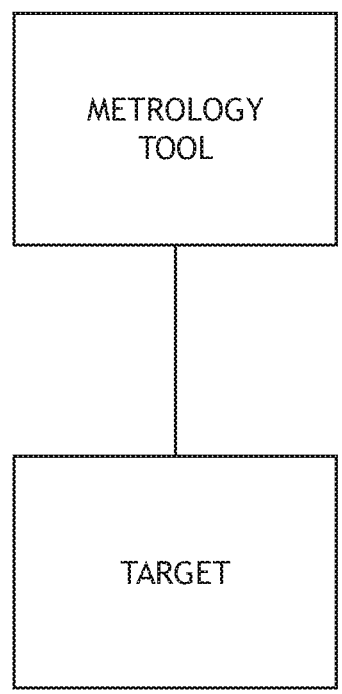
FIG. 8 is a block diagram illustrating metrology signals derived from a target by a metrology tool, according to some embodiments of the invention.

FIG. 7 is a high level flowchart illustrating a method 200, according to some embodiments of the invention. Method 200 may comprise stages for designing producing and/or measuring targets 100, such as any of the following stages, irrespective of their order. Designing and configuring the targets may be carried out at least partially by at least one processor (stage 229).

Method 200 may comprise designing a plurality of 1D elements within an imaging metrology target to provide a respective plurality of one-dimensional (1D) imaging metrology signals along at least two measurement directions (stage 210), and designing a plurality of 2D elements within the imaging metrology target to provide at least one two-dimensional (2D) imaging metrology overlay signal (stage 220), The 1D elements and the 2D elements are designed within the single imaging metrology target, with a periphery of the 1D elements enclosing the 2D elements or with at least partial overlapping of the target regions which occupy the 1D elements and the 2D elements, respectively.

In certain embodiments, method 200 may comprise configuring the 1D elements pairwise, one pair per measurement direction with pair members at different target layers (stage 212) and/or configuring the 2D elements pairwise with pair members at different target layers (stage 222). Method 200 may comprise enclosing the 2D elements within a periphery of the 1D elements (stage 225). For example, the 1D elements may be designed to comprise at least two pairs of 1D elements, one pair along each measurement direction and 1D elements of each pair located at different target layers. The 2D elements may be designed to comprise at least two pairs of 2D elements, wherein 2D elements of each pair are located at different target layers. The 2D elements may be designed to comprise at least two pairs of 2D elements, wherein 2D elements of each pair are located at different target layers.

In certain embodiments, method 200 further comprises segmenting element backgrounds, interspaces between elements and/or the elements themselves (stage 227). Method 200 may further comprise deriving a target design file of the imaging metrology target (stage 228) and/or producing the imaging metrology target (stage 230).

In certain embodiments, a computer program product is provided, which comprises a computer readable non-transitory storage medium having computer readable program embodied therewith, the computer readable program comprising computer readable program configured to design a plurality of 1D elements within an imaging metrology target to provide a respective plurality of one-dimensional (1D) imaging metrology signals along at least two measurement directions; and computer readable program configured to design a plurality of 2D elements within the imaging metrology target to provide at least one two-dimensional (2D) imaging metrology overlay signal, wherein the 1D elements and the 2D elements are designed within the single imaging metrology target, with a periphery of the 1D elements enclosing the 2D elements.

In certain embodiments, method 200 may comprise designing a plurality of 1D elements within an imaging metrology target to provide a respective plurality of one-dimensional (1D) imaging metrology signals along at least two measurement directions (stage 210), designing a plurality of 2D elements within the imaging metrology target to provide at least one two-dimensional (2D) imaging metrology overlay signal (stage 220) and producing the imaging metrology target stage 230), wherein a periphery of the 1D elements encloses the 2D elements, wherein the areas enclosing 1D elements and the areas enclosing the 2D elements are at least partially overlapping, are congruent, or one of the areas encloses the other.

Method 200 may further comprise designing and/or producing the imaging metrology target to be at most 15 µm or 10 µm on each side thereof (stage 232). For example, method 200 may comprise producing the imaging metrology target in die (stage 235). The produced 2D elements may comprise at least two pairs of 2D elements, wherein 2D elements of each pair are located at different target layers, for example the produced 2D elements of each pair may be located at different target layers.

Method 200 may further comprise measuring an imaging metrology signal from the imaging metrology target (stage 245). Method 200 may comprise measuring, simultaneously from a single imaging metrology target, both 1D imaging metrology signals along at least two measurement directions and at least one 2D imaging metrology overlay signal (stage 240).

Targets disclosed in the present invention are designed to allow one-dimensional overlay measurements and two-dimensional overlay measurements from the some target. In certain embodiments, the disclosed targets enable simultaneous measurement of periodic signals and non-periodic signals from a single target. Moreover, disclosed targets are more compact in dimensions from the customary AIM targets, and thus provides, at a size scale similar to current AIMid targets, the possibility to measure both one- and two-dimensional targets. In certain embodiments, the targets are based on combination of AIM and AIMid features and have full flexibility with respect to the allocation of target elements to different layers. The target size may be 10 μm×10 μm and thus provide sufficient essential layer information for critical layer metrology. The target measurement algorithm may enable measuring each layer with its own design (1D vs. 2D) as well as combine and enhance information from the different target components. Advantageously, combining the two target types into a small target improves measurement accuracies and process robustness, especially when the previous layer has low contrast or process compatibility issues.

While the invention is exemplified on AIM and AIMid target elements to represent the one- and two-dimensional approaches to overlay measurements (respectively), it is not to be construed to these specific targets, but be understood generally as using features used to derive a one-dimensional measurement of overlay (i.e., one-dimensional projection signals which are used to calculate the overlay) and features used to derive a two-dimensional measurement of overlay (i.e., one-dimensional centers of target symmetries which are used to calculate the overlay)—in a single target.

In the above description, an embodiment is an example or implementation of the invention. The various appearances of "one embodiment", "an embodiment", "certain embodiments" or "some embodiments" do not necessarily all refer to the same embodiments.

Although various features of the invention may be described in the context of a single embodiment, the features may also be provided separately or in any suitable combination.

Conversely, although the invention may be described herein in the context of separate embodiments for clarity, the invention may also be implemented in a single embodiment.

Certain embodiments of the invention may include features from different embodiments disclosed above, and certain embodiments may incorporate elements from other embodiments disclosed above. The disclosure of elements of the invention in the context of a specific embodiment is not to be taken as limiting their used in the specific embodiment alone.

Furthermore it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described.

Meanings of technical and scientific terms used herein are to be commonly understood as by one of ordinary skill in the art to which the invention belongs, unless otherwise defined.

While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. An imaging metrology target comprising:
   a first plurality of elements designed to provide a plurality of one-dimensional imaging metrology signals along at least two measurement directions; and
   a second plurality of elements designed to provide at least one two-dimensional imaging metrology overlay signal, wherein the second plurality of elements includes at least two pairs of elements, wherein a first element of at least one pair of the at least two pairs of elements is disposed on a first portion of the imaging metrology target, wherein a second element of the at least one pair of the at least two pairs of elements is disposed on a second portion of the imaging metrology target opposite the first portion of the imaging metrology target, wherein a periphery of the imaging metrology target includes the first plurality of elements and the second plurality of elements interspaced on the periphery of the imaging metrology target.

2. The imaging metrology target of claim 1, wherein the first plurality of elements comprise at least two pairs of elements, wherein one pair of the at least two pairs of elements of the first plurality of elements are positioned along each measurement direction of the at least two measurement directions and elements of each pair of the at least two pairs of elements of the first plurality of elements are located at different target layers.

3. The imaging metrology target of claim 1, wherein each pair of the at least two pairs of elements of the second plurality of elements are located at different target layers.

4. The imaging metrology target of claim 1, wherein each of the elements in the first plurality of elements are gratings.

5. The imaging metrology target of claim 1, wherein each of the elements in the second plurality of elements are symmetric with relation to a 180° rotation.

6. The imaging metrology target of claim 1, wherein each of the elements in the second plurality of elements are fourfold rotationally symmetric.

7. The imaging metrology target of claim 1, wherein each of the elements in the second plurality of elements are perpendicular gratings.

8. The imaging metrology target of claim 1, wherein a background of at least one of the first plurality of elements is segmented.

9. The imaging metrology target of claim 1, wherein a background of at least one of the second plurality of elements is segmented.

10. The imaging metrology target of claim 1, wherein at least one of the first plurality of elements is segmented.

11. The imaging metrology target of claim 1, wherein at least one of the second plurality of elements is segmented.

12. The imaging metrology target of claim 1, wherein the imaging metrology target is at most 15 μm×15 μm.

13. The imaging metrology target of claim 1, wherein the imaging metrology target is at most 10 μm×10 μm.

14. An apparatus comprising:
    a metrology tool configured to acquire one or more metrology signals from an imaging metrology target, wherein the metrology tool is configured to derive a one-dimensional metrology signal in two measurement directions of the imaging metrology target and one two-dimensional metrology signal from the imaging metrology target, wherein the imaging metrology target comprises a first plurality of elements designed to provide a plurality of one dimensional imaging metrology signals along at least two measurement directions; and a second plurality of elements designed to provide at least one two dimensional imaging metrology overlay signal, wherein the second plurality of elements includes at least two pairs of elements, wherein a first element of at least one pair of the at least two pairs of elements is disposed on a first portion of the imaging metrology target, wherein a second element of the at least one pair of the at least two pairs of elements is disposed on a second portion of the imaging metrology target opposite the first portion of the imaging metrology target, wherein a periphery of the imaging metrology target includes the first plurality of elements and the second plurality of elements interspaced on the periphery of the imaging metrology target.

15. The apparatus of claim 14, wherein each side of the imaging metrology target is equal to or less than 15 μm.

16. The apparatus of claim 14, wherein the first plurality of elements comprise at least two pairs of elements, wherein one pair of the at least two pairs of elements of the first plurality of elements are positioned along each measurement direction of the at least two measurement directions and elements of each pair of the at least two pairs of elements of the first plurality of elements are located at different target layers.

17. The apparatus of claim 14, wherein each pair of the at least two pairs of elements of the second plurality of elements are located at different target layers.

18. An imaging metrology target comprising:
a first plurality of elements designed to provide a plurality of one-dimensional imaging metrology signals along at least two measurement directions; and
a second plurality of elements designed to provide at least one two-dimensional imaging metrology overlay signal, wherein the second plurality of elements includes a plurality of intercrossing gratings, wherein the first plurality of elements enclose the second plurality of elements.

19. An apparatus comprising:
a metrology tool configured to acquire one or more metrology signals from an imaging metrology target, wherein the metrology tool is configured to derive a one-dimensional metrology signal in two measurement directions of the imaging metrology target and one two-dimensional metrology signal from the imaging metrology target, wherein the imaging metrology target comprises a first plurality of elements designed to provide a plurality of one dimensional imaging metrology signals along at least two measurement directions; and a second plurality of elements designed to provide at least one two dimensional imaging metrology overlay signal, wherein the second plurality of elements includes a plurality of intercrossing gratings, wherein the first plurality of elements enclose the second plurality of elements.

20. The apparatus of claim 19, wherein the second plurality of elements comprise at least two pairs of elements, wherein elements of each pair of the at least two pairs of elements are located at different target layers.

21. The apparatus of claim 19, wherein each side of the imaging metrology target is equal to or less than 15 μm.

* * * * *